United States Patent [19]

Tachiyama

[11] Patent Number: 5,523,711
[45] Date of Patent: Jun. 4, 1996

[54] SIGNAL DELAYING OUTPUTTING CIRCUIT

[75] Inventor: Tsuyoshi Tachiyama, Tokyo, Japan

[73] Assignee: NEC Corporation, Tokyo, Japan

[21] Appl. No.: 358,592

[22] Filed: Dec. 14, 1994

[30]   Foreign Application Priority Data

Dec. 16, 1993   [JP]   Japan .................... 5-317011

[51] Int. Cl.⁶ ........................... H03K 17/14; H03K 5/13
[52] U.S. Cl. .................... 327/262; 327/288; 327/513; 327/276
[58] Field of Search .................... 327/261, 262, 327/276, 277, 278, 281, 284, 285, 288, 513; 326/32

[56]   References Cited

U.S. PATENT DOCUMENTS

| | | | |
|---|---|---|---|
| 4,473,762 | 9/1984 | Iwahashi et al. | 327/262 |
| 4,988,897 | 1/1991 | Jeong | 327/513 |
| 5,118,971 | 6/1992 | Schenck | 326/32 |
| 5,121,014 | 6/1992 | Huang | 327/277 |
| 5,231,319 | 7/1993 | Crafts et al. | 327/284 |
| 5,291,071 | 3/1994 | Allen et al. | 327/513 |

FOREIGN PATENT DOCUMENTS

| | | |
|---|---|---|
| 62-224127 | 10/1987 | Japan . |
| 4192913 | 7/1992 | Japan .................... 327/262 |

*Primary Examiner*—Timothy P. Callahan
*Assistant Examiner*—Eunja Shin
*Attorney, Agent, or Firm*—Foley & Lardner

[57]   ABSTRACT

A signal delaying outputting circuit is disclosed which can prevent an excessive increase in dead time at a high temperature without requiring a large chip area. The signal delaying outputting circuit comprises a first invertor circuit driven by an input signal, and a second invertor circuit driven by an output signal of the first invertor circuit. A first auxiliary MOS FET of the same channel type as that of one of two first p- and n-channel MOS FETs of the first invertor circuit is provided in the first converter circuit in an integral continuous relationship with the one MOS FET such that they have separate gates from each other but have a common source or drain. A second auxiliary MOS FET of the same channel type as that of one of second p- and n-channel MOS FETs of the second invertor circuit but different from that of the first auxiliary MOS FET is provided in the second invertor circuit in an integral continuous relationship such that they have separate gates from each other but have a common source or drain. The first and second auxiliary MOS FETs are switched in response to a binary output signal of a temperature detection circuit.

3 Claims, 8 Drawing Sheets

SIGNAL DELAYING OUTPUTTING CIRCUIT

BACKGROUND OF THE INVENTION

1. Field of the Invention

This invention relates to a signal delaying outputting circuit which delays an input signal by a predetermined time and amplifies the signal by current amplification to provide an output signal to be used to drive a circuit at a next stage.

2. Description of the Related Art

When an output signal of a drive circuit which amplifies an input signal by current amplification is used to drive another circuit at a next stage, normally it is required to minimize a transfer lag of a signal arising from a switching operation of the drive circuit so that the input signal may be transmitted at a high speed to the circuit at the next stage. However, depending upon the construction of the circuit at the next stage to be driven, it is sometimes preferable to receive the input signal after it is delayed by a predetermined time by the drive circuit.

One of the circuits of the type just mentioned is such an H bridge circuit for driving a motor as shown in FIG. 8. Referring to FIG. 8, the H bridge circuit 1 shown includes four transistors T1, T2, T3 and T4 and a motor 2 connected in an H bridge connection. When it is intended to rotate the motor 2 forwardly, the transistors T1 and T4 are turned on while the other transistors T2 and T3 are turned off so that electric current flows from the transistor T1 to the transistor T4 by way of the motor 2. On the contrary when it is intended to rotate the motor 2 reversely, the transistors T2 and T3 are turned on while the transistors T1 and T4 are turned off so that electric current flows from the transistor T2 to the transistor T3.

Here, if a pair of transistors in the circuit shown at upper and lower locations in FIG. 8, for example, the transistors T1 and T3, simultaneously enter into an on state upon switching in phase of the motor 2, then high through-current flows from a high voltage power source terminal $V_{DD}$ to a low voltage power source terminal $V_{SS}$, resulting in occurrence of such a bad effect that noise is produced or the power dissipation is increased. In order to prevent this, normally the timing at which each of a pair of upper and lower transistors is turned on is delayed with respect to the timing at which the other of the transistors is turned off so that they may not exhibit an on-state at a time. This similarly applies to the case wherein metal oxide semiconductor field effect transistors (MOS FETs) are employed in place of the transistors T1, T2, T3 and T4.

Such a signal delaying outputting circuit as shown in FIG. 9 is conventionally employed as a drive circuit whose output signals provide such different timings as described above. Referring to FIG. 9, the signal delaying outputting circuit 3 shown includes a complementary MOS (CMOS) invertor circuit at a first stage including a p-channel MOS FET 4P1 and an n-channel MOS FET 4N1, and a CMOS invertor at a second stage including a p-channel MOS FET 4P2 and an n-channel MOS FET 4N2. The dead time of the signal delaying outputting circuit 3 for delaying an input signal is provided by transmission delaying operations of the CMOS invertor circuits at the two stages.

With the signal delaying outputting circuit 3, however, since the transmission delaying operation of the gate of each MOS FET has a temperature characteristic, the dead time is liable to be varied by the temperature. Particularly at a high temperature, such a problem that the transmission delay time becomes so long that the switching time goes out of a specification set therefor sometimes occurs.

One of countermeasures to improve the problem is disclosed, for example, in Japanese Patent Laid-Open Application No. 62-224117. The circuit disclosed in the document is shown in FIG. 10. Referring to FIG. 10, the circuit includes a CMOS invertor circuit 6 including a p-channel MOS FET 5P1 and an n-channel MOS FET 5N1, and an auxiliary drive circuit 9 interposed between an output terminal 7 of the CMOS invertor circuit 6 and a ground terminal $V_{SS}$ and including an n-channel MOS FET 8N1 and an n-channel MOS FET 8N2. In the circuit, the resistance between the output terminal 7 and the ground terminal $V_{SS}$, which is provided by the two MOS FETs 8N1 and 8N2, varies in response to the temperature of the circuit to compensate for the outputting capacity from the output terminal 7 of the terminal to prevent the turn-off time of the CMOS invertor circuit 6 from being increased remarkably at a high temperature. It is to be noted that the two MOS FETs 5P1 and 5N1 of the CMOS invertor circuit 6 are connected to receive a signal from an input terminal 12 by way of a pair of invertor circuits 10 and 11 which serve as amplification stages, respectively.

With the circuit construction of FIG. 10, however, since the turn-off time is controlled in response to a temperature variation only by the single CMOS invertor circuit 6 at the last stage, the following problem is involved where it is intended to drive the gates of MOS FETs of an H bridge circuit connected to the next stage to the circuit. In particular, referring to FIG. 10, in order to prevent the p-channel MOS FET 5P1 and the n-channel MOS FET 5N1 of the CMOS invertor circuit 6 from being simultaneously turned on to cause through-current to flow through the circuit, when the output from the output terminal 7 changes in level from a HIGH level to a LOW level, it is necessary, for example, to advance turning off and retard turning on of the p-channel MOS FET 5P1. To this end, the ratio W/L between the gate width W and the gate length L of a MOS FET which constitutes the invertor circuit 10 at the preceding stage to the p-channel MOS FET 5P1 must be made considerably high, and the value of the ratio W/L increases as the capacitances of the MOS FETs constituting the H bridge circuit increase. Since the capacitances of MOS FETs constituting an H bridge circuit for driving a motor are generally high, the gate width W of the MOS FET constituting the invertor circuit 10 is on the order of several thousands μm. Accordingly, the circuit construction shown in FIG. 10 is disadvantageous in that the chip area is comparatively large.

SUMMARY OF THE INVENTION

It is an object of the present invention to provide a signal delaying outputting circuit which can prevent a variation of a dead time of an output signal by a temperature variation, particularly, an excessive increase in dead time at a high temperature without requiring a large chip area.

In order to attain the object described above, according to the present invention, there is provided a signal delaying outputting circuit having an input terminal, an output terminal, a high voltage power source terminal and a low voltage power source terminal, comprising a first invertor circuit including a first p-channel MOS FET and a first n-channel MOS FET connected in series between the high voltage power source terminal and the low voltage power source terminal and driven by a signal from the input terminal for delaying and amplifying the signal from the input terminal by current amplification, a second invertor circuit including a second p-channel MOS FET and a second n-channel MOS FET connected in series between the high voltage power source terminal and the low voltage power source terminal and driven by an output signal of the first invertor circuit for delaying and amplifying the output signal of the first invertor by current amplification, the output terminal being connected to a junction between the second p- and n-channel MOS FETs of tile second invertor circuit to output the signal delayed and amplified by the first and second invertor circuits, a first auxiliary MOS FET of the same channel type as that of one of the first p- and n-channel MOS FETs of the first invertor circuit, the first auxiliary MOS FET being provided in the first invertor circuit in all integral continuous relationship such that it has a gate separate from a gate of the one MOS FET but has a source or a drain commonly with the one MOS FET, a second auxiliary MOS FET of the same channel type as that of one of the second p- and n-channel MOS FETs of the second invertor circuit but different from that of the first auxiliary MOS FET, the second auxiliary MOS FET being provided in the second invertor circuit in an integral continuous relationship such that it has a gate separate from a gate of the one MOS FET but has a source or a drain commonly with the one MOS FET, and a temperature detection circuit for detecting whether a temperature of the signal delaying outputting circuit is higher than a predetermined level and outputting a result of the detection as a binary signal to control switching operations of the first and second auxiliary MOS FETs.

Preferably, the switching operation of one of the first and second auxiliary MOS FETs is controlled by a logical OR signal of the signal from the input terminal and an output signal of the temperature detection circuit, and the switching operation of the other of the first and second auxiliary MOS FETs is controlled by an inverted signal of the logical OR signal.

The signal delaying outputting circuit may be constructed such that each of the first and second auxiliary MOS FETs and the temperature detection circuit is provided by an equal plural number, and the first auxiliary MOS FETs are provided in an integral continuous relationship such that each of them has a gate separate from the gate of one of the first p- and n-channel MOS FETs but has a source or a drain commonly with the one MOS FET while the second auxiliary MOS FETs are provided in an integral continuous relationship such that each of them has a gate separate from the gate of one of the second p- and n-channel MOS FETs but has a source or a drain commonly with the one MOS FET, the switching operations of the first and second auxiliary MOS FETs being controlled by output signals of the corresponding temperature detection circuits.

Preferably, in each of the first and second invertor circuits, the on-state resistances of the auxiliary MOS FET and the one MOS FET integral with and continuous to the auxiliary MOS FET are higher than the on-state resistance of the other MOS FET for which the auxiliary MOS FET is not provided.

In the signal delaying outputting circuit according to the present invention, one or a plurality of first auxiliary MOS FETs are provided in the first invertor circuit while one or a plurality of second auxiliary MOS FETs are provided in the second invertor circuit. Each first auxiliary MOS FET is provided in an integral continuous relationship to a first p- or n-channel MOS FET as a main MOS FET such that the gate is divided into two gates for the two MOS FETs while the source or drain is provided commonly between the two MOS FETs, or in other words, the two MOS FETs have separate gates but have a common source or drain. Meanwhile, each second auxiliary MOS FET is provided in an integral continuous relationship to a second n- or p-channel MOS FET as a main MOS FET such that the gate is divided into two gates for the two MOS FETs while the source or drain is provided commonly between the two MOS FETs, or in other words, the two MOS FETs have separate gates but have a common source or drain. Accordingly, in the MOS FETs of each unit in which the two MOS FETs are provided integrally with and continuously to each other, while the number of the sources or drains increases comparing with that of a conventional unit which does not include any auxiliary MOS FET, the gate width presents little different from that of the conventional unit, and consequently, the amount of increase in source area or drain area is only a little. Further, since, while the divisional gates are provided separately, the total gate length L of them is substantially equal to that of the conventional unit and the gate width W is substantially equal to that of the conventional unit, the gate area is substantially equal to that of the conventional unit. Accordingly, the increased amount of the total area provided by the auxiliary MOS FET corresponds to the increased area of the sources or drains, and the value of such increase can be restricted to as small as, for example, approximately 10 µm×20 µm.

With the signal delaying outputting circuit of the present invention, when the temperature detected by the temperature detection circuit for detecting the temperature of the signal delaying outputting circuit is lower than the predetermined level, both of the first and second auxiliary MOS FETs exhibit an off-state. Consequently, an input signal from the input terminal undergoes transmission delaying actions by the first p-channel MOS FET and the first n-channel MOS FET of the first invertor circuit except the first auxiliary MOS FET and by the second p-channel MOS FET and the second n-channel MOS FET of the second invertor circuit except the second auxiliary MOS FET. The transmission delay times by the first and second invertor circuits increase as the temperature rises. In this instance, since the auxiliary MOS FET in each unit in which the MOS FETs are provided in an integral continuous relationship is in an off-state in which the gate does not act, the ratio between the gate width and the gate length of the MOS FETs in each unit is actually provided by the ratio between the total gate width of the MOS FETs and the total gate length of the MOS FETs minus the length of the gate of the auxiliary MOS FET. In other words, where the two MOS FETs of each unit have divisional gates whose total width is W and the gate length of the main MOS FET is represented by $L_1$, the gate length of the auxiliary MOS FET is represented by $L_2$ and the total gate length is represented by $L=L_1+L_2$, the ratio between the gate width and the gate length when the auxiliary MOS FET is in an off-state is given by $W/L_1$.

When the temperature of the signal delaying outputting circuit rises until the detection temperature of the temperature detection circuit exceeds the predetermined level, the first auxiliary MOS FET of the first invertor circuit and the second auxiliary MOS FET of the second invertor circuit make switching operations to enter into an on-state in response to a binary signal from the temperature detection circuit. Accordingly, in this instance, since both of the main MOS FET and the auxiliary MOS FET in each unit are switched on, the ratio between the gate width and the gate length of the MOS FETs including the auxiliary MOS FET is defined by the ratio $W/L_1$ between the gate width and the gate length of the main MOS FET and the ratio $W/L_2$ between the gate width and the gate length of the auxiliary MOS FET. Accordingly, the ratio then is lower than that when the auxiliary MOS FET is in an off-state. Consequently, the total transmission delay time of any of the first and second invertor circuits drops suddenly as the auxiliary MOS FET is turned on. Then, as the temperature thereafter rises, the transmission delay time increases monotonously again. Consequently, an excessive increase in transmission delay time at a high temperature can be prevented, and a transmission delay time longer than a fixed time can be assured until the detection temperature exceeds a predetermined level.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1:
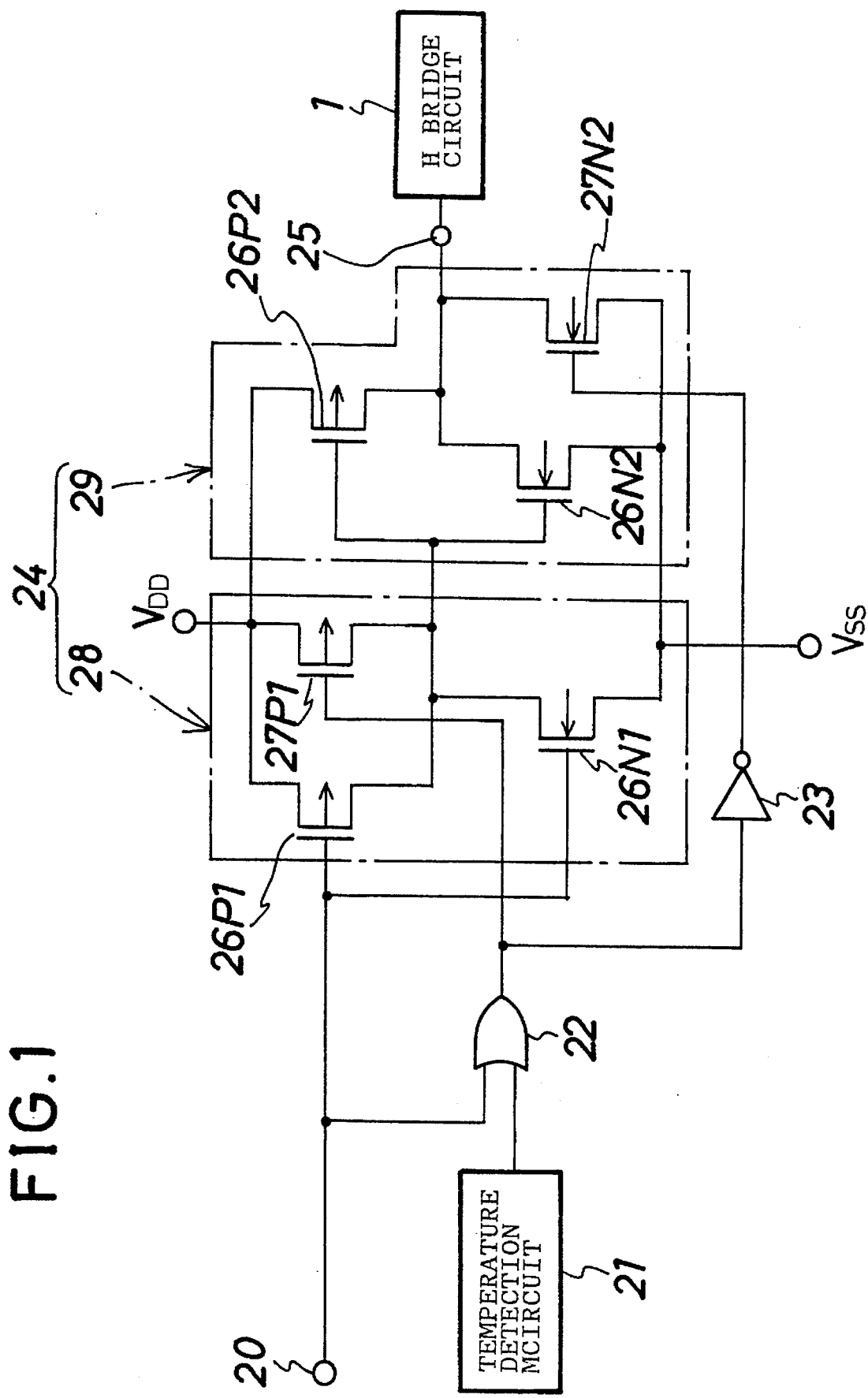
FIG. 1 is a circuit diagram of a signal delaying outputting circuit showing a preferred embodiment of the present invention.
Figure 8:
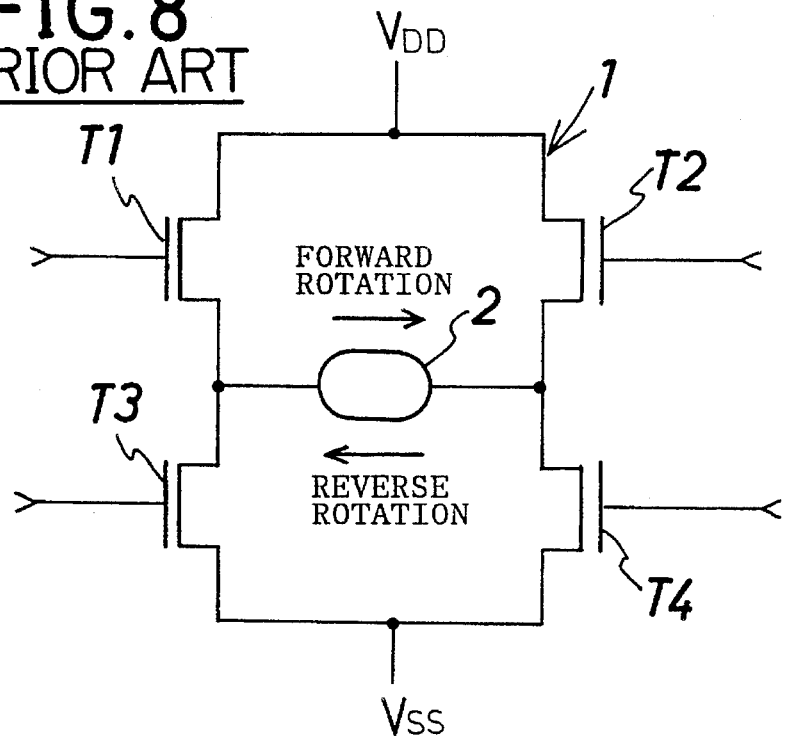
FIG. 8 is a circuit diagram of a motor driving H bridge circuit which is driven by the output of a signal delaying outputting circuit.

Referring first to FIG. 1, there is shown a signal delaying outputting circuit according to a first preferred embodiment of the present invention. The signal delaying outputting circuit shown has an input terminal 20 and an output terminal 25 and includes a single temperature detection circuit 21, an OR circuit 22 for logically ORing an input signal from the input terminal 20 and a binary signal outputted from the temperature detection circuit 21, a NOT circuit 23 for inverting a binary signal from the OR circuit 22, and a delay circuit 24 for delaying an input signal inputted from the input terminal 20 and amplifying the input signal by current amplification. The output of the delay circuit 24 is outputted to the outside from the output terminal 25. The output terminal 25 may be connected to, for example, such an H bridge circuit 1 as shown in FIG. 8 directly or by way of a buffer not shown.

The delay circuit 24 includes a first CMOS invertor circuit 28 including a first p-channel MOS FET 26P1, a first n-channel MOS FET 26N1 and a first auxiliary p-channel MOS FET 27P1, and a second CMOS invertor circuit 29 including a second p-channel MOS FET 26P2, a second n-channel MOS FET 26N2 and a second auxiliary n-channel MOS FET 27N2.

The first p-channel MOS FET 26P1 and the first n-channel MOS FET 26N1 are connected in series between a high voltage power source terminal $V_{DD}$ and a ground terminal $V_{SS}$. Similarly, the second p-channel MOS FET 26P2 and the second n-channel MOS FET 26N2 are connected in series between the high voltage power source terminal $V_{DD}$ and the ground terminal $V_{SS}$, and the output terminal 25 is connected to a junction between the second p-channel MOS FET 26P2 and the second n-channel MOS FET 26N2.

Figure 2A:
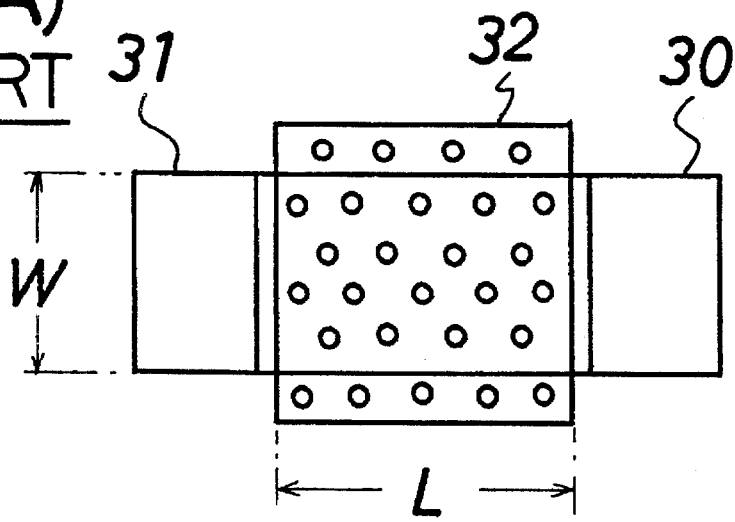
FIG. 2(A) is a diagrammatic view showing a layout of the gate, the source and the drain of a MOS FET element of a conventional single structure.
Figure 2B:
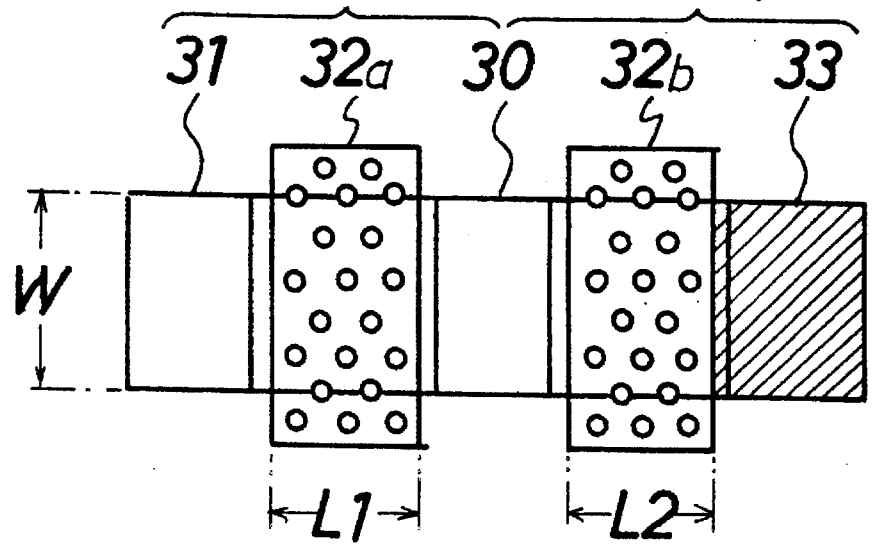
FIG. 2(B) is a similar view but showing a layout of another MOS FET element of a double structure according to the present invention.

The first p-channel MOS FET 26P1 and the first auxiliary MOS FET 27P1 are connected in parallel as shown in FIG. 1 when represented in an equivalent circuit. The two MOS FETs in an actual structure on a chip, however, are constructed in a double structure wherein they are provided in such a continuous single unit that the gate is divided into two gates for the two MOS FETs while the source or drain is provided commonly between the two MOS FETs, or in other words, the two MOS FETs have separate gates but have a common source or drain. FIG. 2(A) shows the layout of the gate, source and drain of a MOS FET of a conventional single structure while FIG. 2(B) shows the layout of the double structure according to the present invention. In such a single structure as shown in FIG. 2(A), a single source 30 and a single drain 31 are disposed on the opposite sides of a single gate 32. In contrast, in the double structure according to the present invention, the gate 32 as in the conventional single structure is divided into two gates 32a and 32b as shown in FIG. 2(B), and a source 30 is disposed between the gates 32a and 32b while two drains 31 and 33 are disposed on the opposite outer sides of the gates 32a and 32b. Thus, the two MOS FETs 26P1 and 27P1 have the common source 30, and the first p-channel MOS FET 26P1 is constituted from the source 30, the gate 32a and the drain 31 while the first auxiliary MOS FET 27P1 is constituted from the same source 30, the gate 32b and the drain 33. It is to be noted that another structure wherein two MOS FETs have a single common drain and have two sources disposed on the opposite outer sides of the two gates may alternatively be employed.

Where the gate length of the single structure of FIG. 2(A) is represented by L and the effective gate width is represented by W, the effective gate width in the double structure of FIG. 2(B) is similarly equal to W, and where the gate lengths of the two gate 32a and gate 32b are represented by L1 and L2, respectively, the gate length of the double structure is L1+L2=L. Accordingly, the increased amount of the area caused by dividing the gate into two gates corresponds to the area of the additionally provided drain 33 as indicated by slanting lines. Where the value of the width W ranges from 10 μm to 20 μm, the increased amount of the area is approximately 10 μm×20 μm.

Referring back to FIG. 1, while also the second n-channel MOS FET 26N2 and the second auxiliary MOS FET 27N2 is connected in parallel when represented by an equivalent circuit, also the two MOS FETs have a similar double structure to that described above.

An input signal from the input terminal 20 is inputted to the gate of the first p-channel MOS FET 26P1 and the gate of the first n-channel MOS FET 26N1, and the output of the first CMOS invertor circuit 28 is inputted to the gate of the second p-channel MOS FET 26P2 and the gate of the second n-channel MOS FET 26N2. Further, the output of the OR circuit 22 is inputted to the gate of the first auxiliary MOS FET 27P1, and the output of the OR circuit 22 is inputted to the gate of the second auxiliary MOS FET 27N2 after it is logically inverted by the NOT circuit 23.

Figure 3:
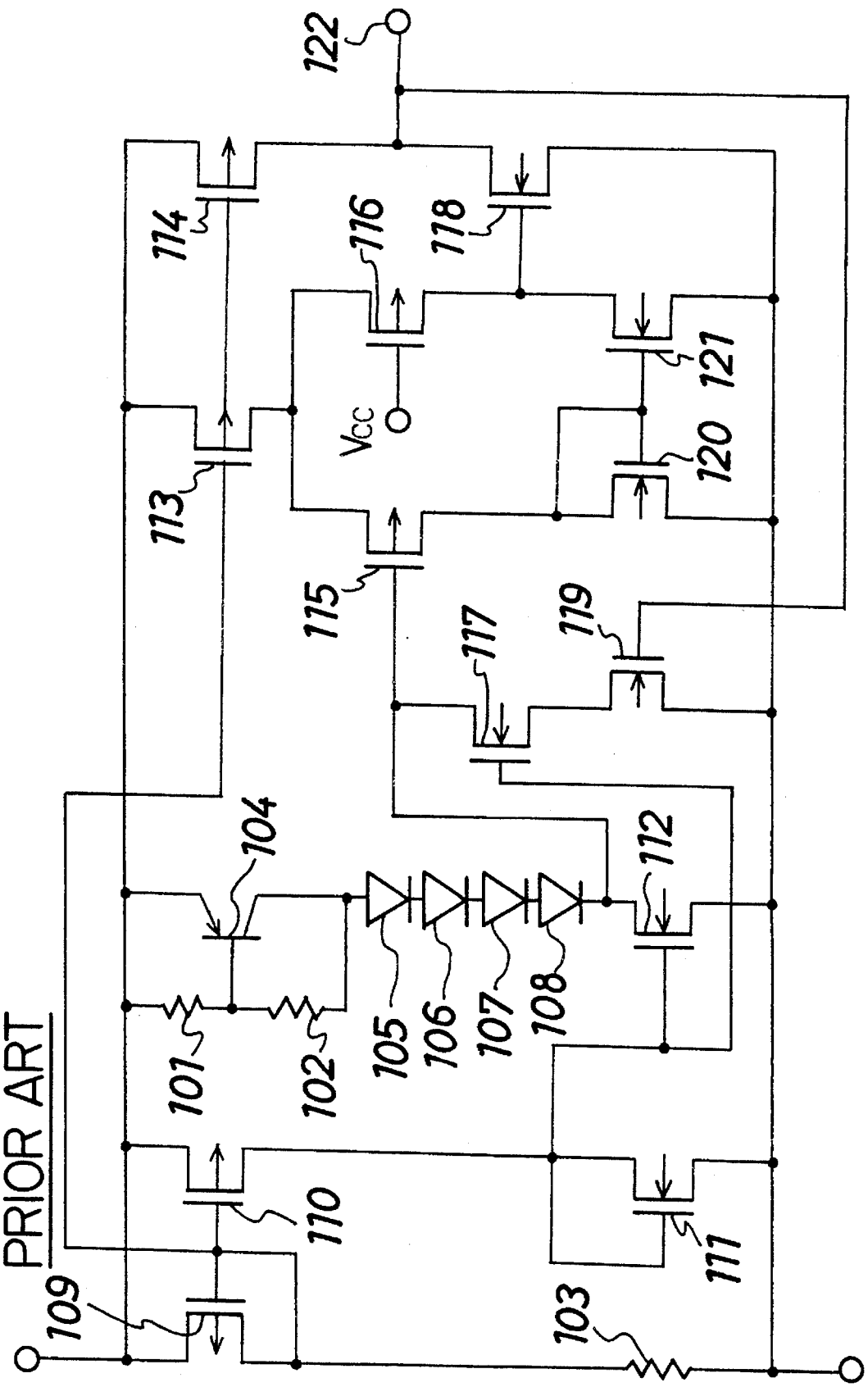
FIG. 3 is a circuit diagram showing a detailed construction of a temperature detection circuit in the signal delaying outputting circuit shown in FIG. 1.

A detailed construction of the temperature detection circuit 21 is shown in FIG. 3. Referring to FIG. 3, the temperature detection circuit 21 includes resistors 101, 102 and 103, a transistor 104, diodes 105 to 108, and MOS FETs 109 to 121. A temperature detection circuit of the type described is employed in the product "μPD16801" provided as a power MOS IC for an automobile circuit from NEC Corporation, who is the assignee of the present invention, and is already known in the art. The temperature detection circuit outputs a signal of a HIGH level from an output terminal 122 thereof when the temperature is equal to or lower than a preset detection temperature T, but outputs a signal of a LOW level when the temperature is higher than the preset detection temperature. The preset detection temperature T can be adjusted by varying the resistance values of the resistors 101 and 102.

Operation of the signal delaying outputting circuit of the first embodiment of the present invention shown in FIG. 1 will be described below.

When the temperature of the signal delaying outputting circuit is equal to or lower than the preset detection temperature T of the temperature detection circuit 21, the first p-channel MOS FET 26P1 and the first n-channel MOS FET 26N1 of the first CMOS invertor circuit 28 are turned on while the first auxiliary MOS FET 27P1 is turned off in response to an input signal from the input terminal 20. Meanwhile, the second p-channel MOS FET 26P2 and the second n-channel MOS FET 26N2 of the second CMOS invertor circuit 29 are turned on but the second auxiliary MOS FET 27N2 is turned off in response to the output of the first CMOS invertor circuit 28. Consequently, the input signal is delayed and amplified by current amplification by the MOS FETs 26P1, 26N1, 26P2 and 26N2, which are all in an on-state, and outputted from the output terminal 25. The H bridge circuit 1 is turned on in response to a HIGH level of the output of the output terminal 25, but is turned off in response to a LOW level of the output of the output terminal 25.

If the temperature of the signal delaying outputting circuit exceeds the preset detection temperature T of the temperature detection circuit 21, then the output of the temperature detection circuit 21 changes from a HIGH level to a LOW level. Consequently, both of the first auxiliary MOS FET 27P1 and the second auxiliary MOS FET 27N2 are turned on. The transmission delay time of the first and second CMOS invertor circuits 28 and 29 decrease suddenly as the first auxiliary MOS FET 27P1 and 27P2 are turned on.

Figure 4:
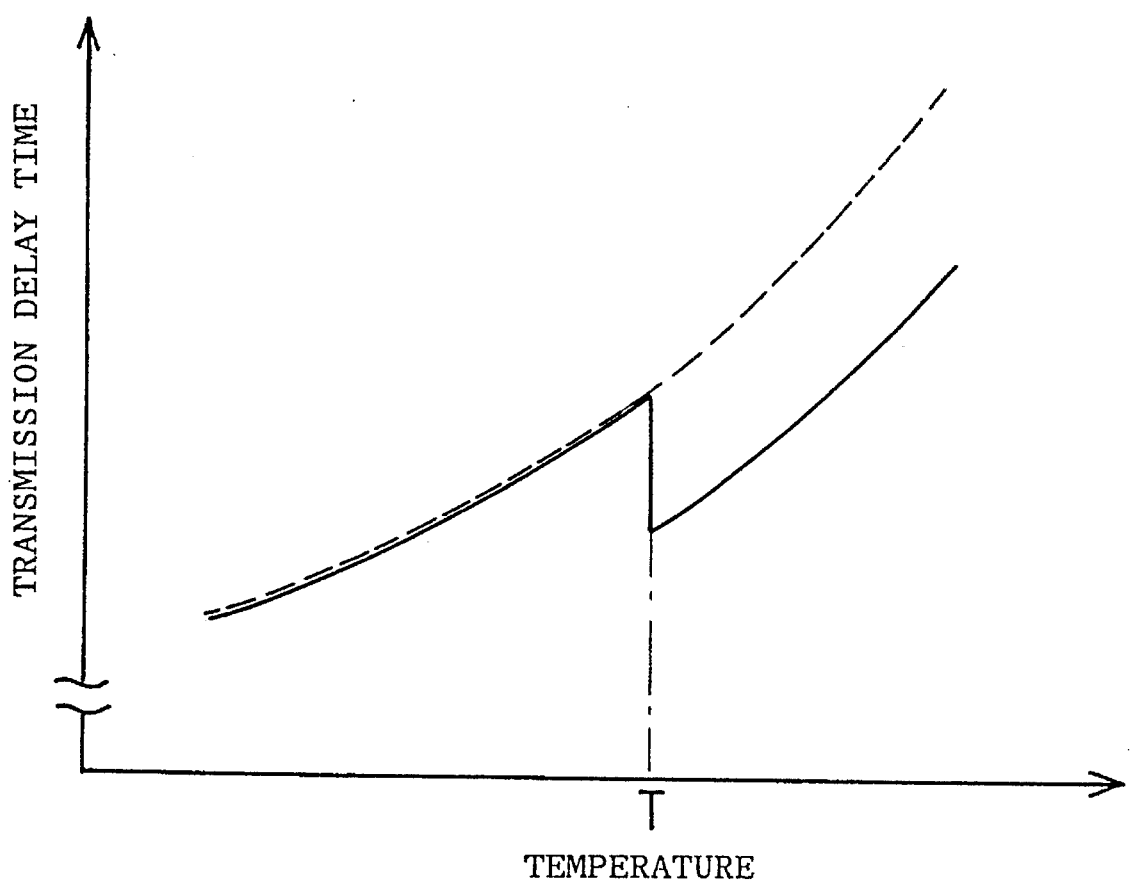
FIG. 4 is a graph illustrating a delay characteristic of the signal delaying outputting circuit of FIG. 1 with respect to a temperature variation together with a delay characteristic of a conventional signal delaying outputting circuit.
Figure 9:
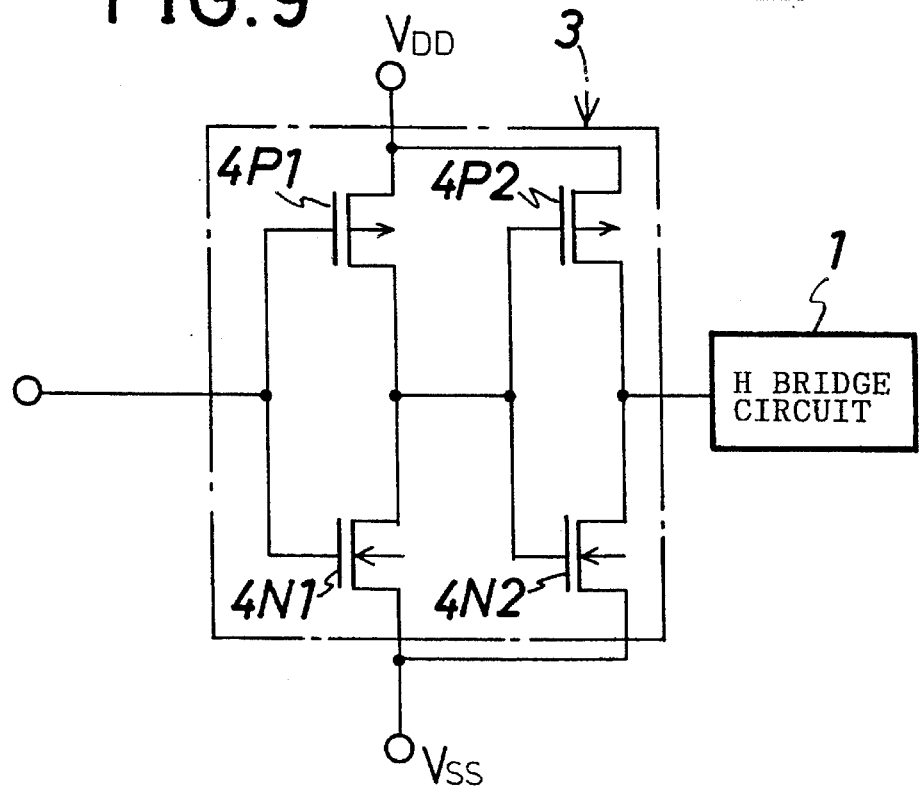
FIG. 9 is a circuit diagram of a conventional signal delaying outputting circuit.
Figure 10:
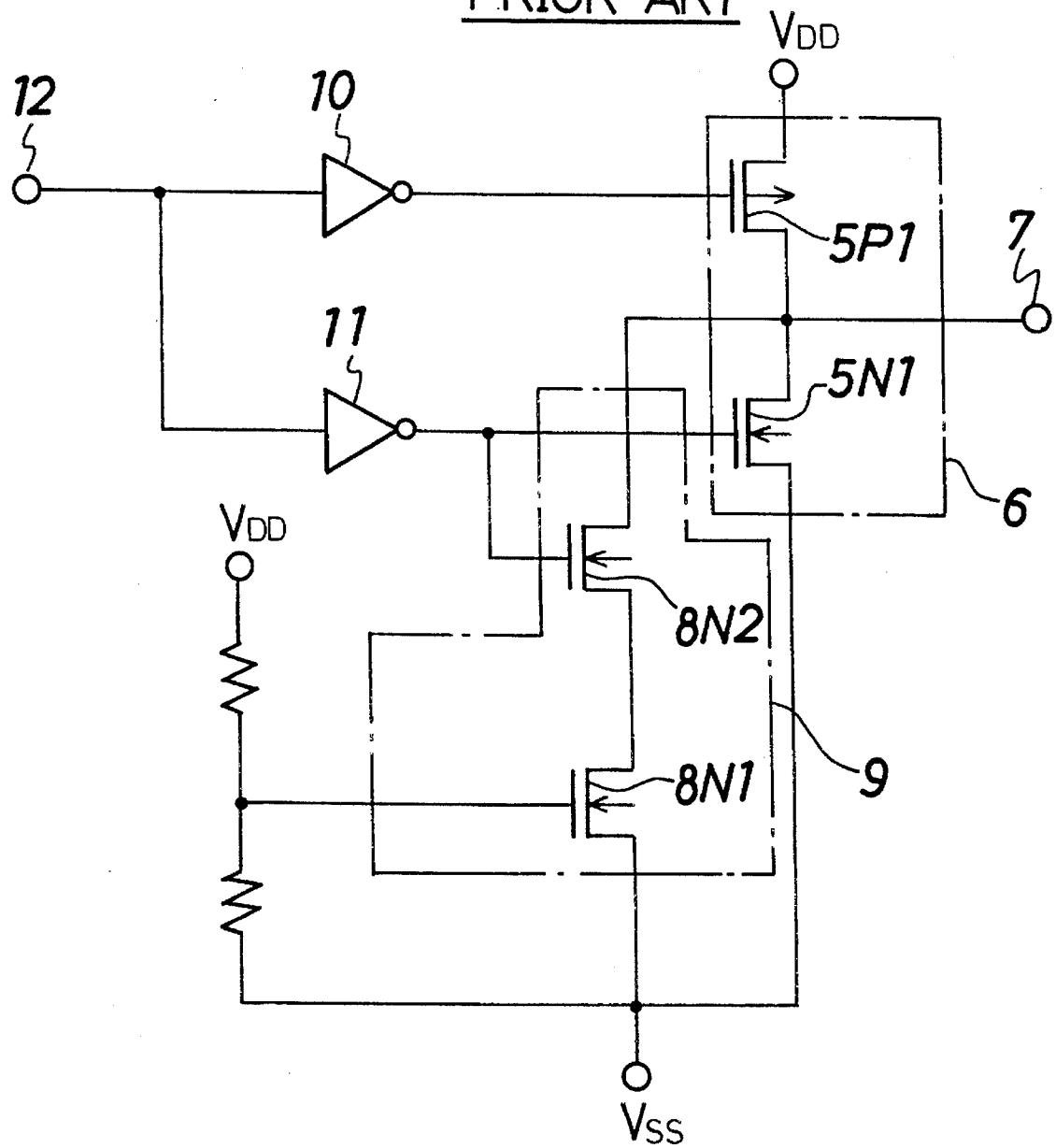
FIG. 10 is a circuit diagram of another conventional signal delaying outputting circuit.

FIG. 4 illustrates the a delay characteristic of the signal delaying outputting circuit of the first embodiment of the present invention with respect to the temperature variation in comparison with that of the conventional signal delaying outputting circuit shown in FIG. 9. In FIG. 4, the axis of abscissa represents the temperature while the axis of ordinate represents the transmission delay time, and the solid line indicates the characteristic of the signal delaying outputting circuit of the first embodiment of the present invention while the broken line indicates the characteristic of the conventional signal delaying outputting circuit. From FIG. 9, it can be seen that, below the preset detection temperature T, the transfer delay times of both of the circuit of the present invention and the conventional circuit increase substantially in proportion to a temperature rise while exhibiting substantially same transitions. However, while the transmission delay time of the conventional circuit continues to exhibit a similar increase also above the preset detection temperature T, the transmission delay time of the circuit of the present invention drops suddenly to a certain level at the preset detection temperature T and then exhibits a similar increase from the certain level. Accordingly, with the signal delaying outputting circuit of the present invention, an excessive increase in dead time at a high temperature can be prevented.

In the signal delaying outputting circuit shown in FIG. 1, where the on-state resistances of the p-channel MOS FETs 26P1 and 27P1 which have a double structure and the on-state resistances of the n-channel MOS FETs 26N2 and 27N2 which have a double structure are set sufficiently higher than the on-state resistances of the first n-channel MOS FET 26N1 and the second p-channel MOS FET 26P2 of the single type, the turn-on transmission delay time of the H bridge circuit 1 becomes longer than the turn-off delay time, and consequently, the through-current of the H bridge circuit 1 is decreased.

Further, the value of the voltage delay time can be adjusted arbitrarily by individually changing the ratios between the on-state resistances of the p-channel MOS FETs 26P1, 26P2 and 27P1 and the n-channel MOS FETs 26N1, 26N2 and 27N2.

It is to be noted that, while, in the signal delaying outputting circuit of FIG. 1, the first CMOS invertor circuit 28 includes p-channel MOS FETs of a double structure and the second CMOS invertor circuit 29 includes n-channel MOS FETs of a double structure, alternatively the first CMOS invertor circuit 28 may include n-channel MOS FETs of a double structure while the second CMOS invertor circuit 29 include p-channel MOS FETs of a double structure. In this instance, the OR circuit 22 is replaced by an AND circuit.

Figure 5:
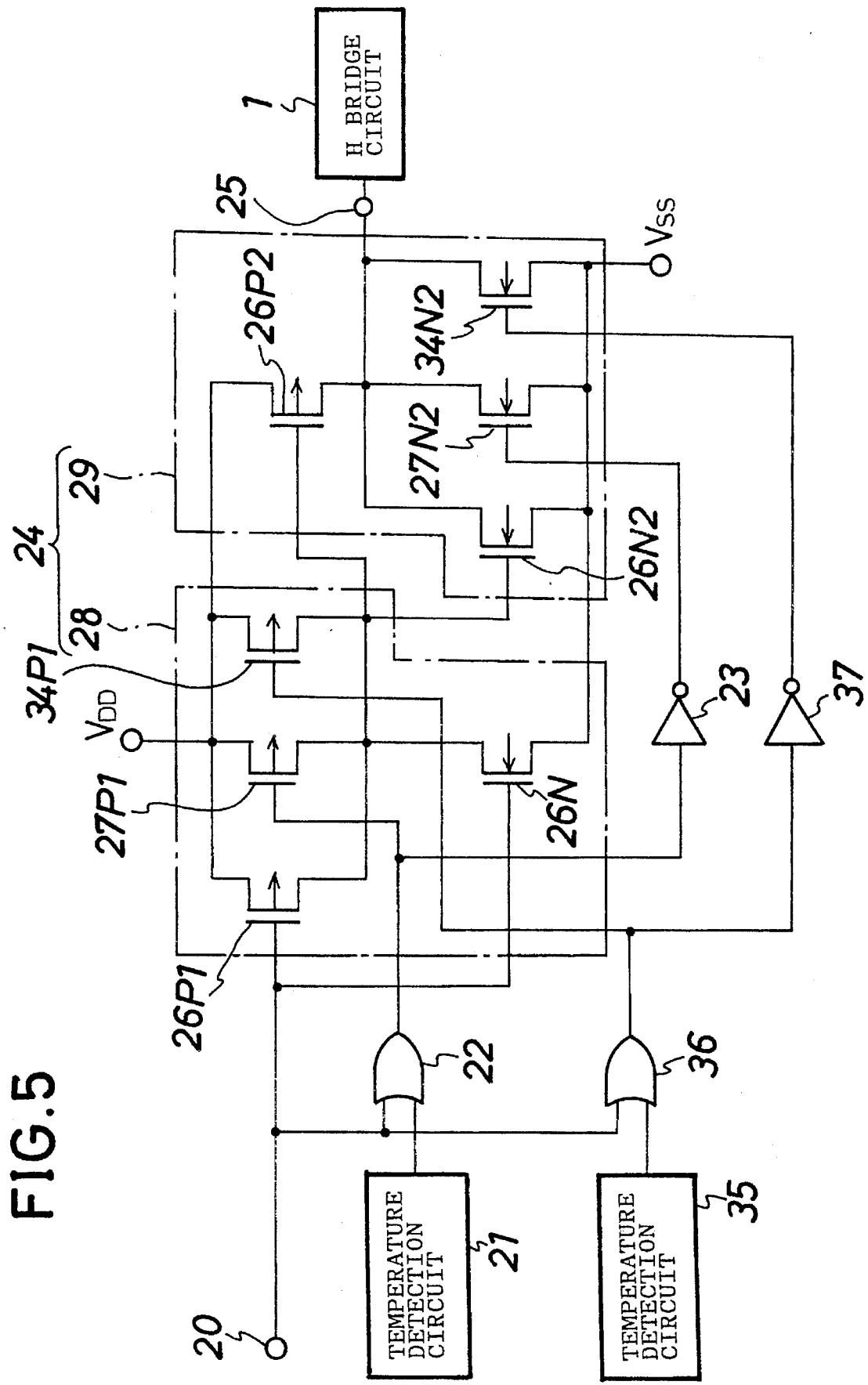
FIG. 5 is a circuit diagram of another signal delaying outputting circuit showing a second preferred embodiment of the present invention.

Referring now to FIG. 5, there is shown a signal delaying outputting circuit according to a second preferred embodiment of the present invention. The present signal delaying outputting circuit is a modification to the signal delaying outputting circuit of the first embodiment described hereinabove with reference to FIG. 1 and includes several additional elements. In particular, the first CMOS invertor circuit 28 includes, in addition to the first auxiliary MOS FET 27P1, another auxiliary p-channel MOS FET 34P1. The two auxiliary MOS FETs 27P1 and 34P1 are connected, in an equivalent circuit, in parallel to the first p-channel MOS FET 26P1. Similarly, the second CMOS invertor circuit 29 includes, in addition to the second auxiliary MOS FET 27N2, another auxiliary n-channel MOS FET 34N2. The two second auxiliary MOS FETs 27N2 and 34N2 are connected, in an equivalent circuit, in parallel to the second n-channel MOS FET 26N2. Further, the signal delaying outputting circuit includes, in addition to a first gate control circuit for the auxiliary MOS FETs 27P1 and 27N2 which is constituted from the temperature detection circuit 21 and the OR circuit 22 and the NOT circuit 23 which logically process a binary output signal of the temperature detection circuit 21, a second gate control circuit which is constituted from another temperature detection circuit 35, and another OR circuit 36 and another NOT circuit 37 for logically processing a binary output signal of the temperature detection circuit 35. The output of the OR circuit 36 is inputted to the gate of the auxiliary p-channel MOS FET 34P1 while the output of the OR circuit 36 is inputted to the gate of the auxiliary n-channel MOS FET 34N2 after it is logically inverted by the NOT circuit 37.

Figure 6:
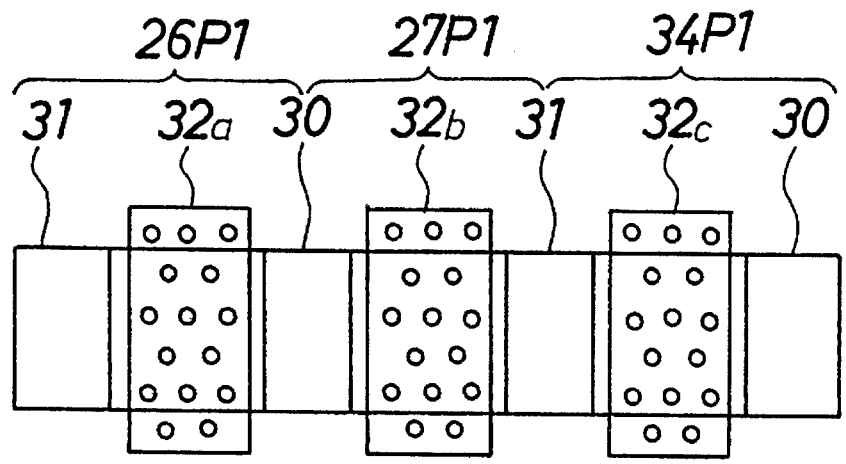
FIG. 6 is a diagrammatic view showing a layout of a MOS FET element of a triplet structure according to the present invention.

The three MOS FETs 26P1, 27P1 and 34P1 constituting the first CMOS invertor circuit 28 have, in an actual structure on a chip, a triplet structure wherein they are provided in such a continuous single unit that the gate is divided into three gates for the three MOS FETs while a source and a drain are provided commonly between different two adjacent MOS FETs, or in other words, the three MOS FETs have separate gates but have a common source and a common drain as well as a separate source and a separate drain. FIG. 6 shows the layout of the triplet structure. Referring to FIG. 6, the gate of the unit shown is divided into three gates 32a, 32b and 32c, and a pair of sources 30 are disposed between the gates 32a and 32b and on the outer side (right side in FIG. 6) of the gate 32 while a pair of drains 31 are disposed between the gates 32a and 32c and on the outer side (left side in FIG. 6) of the gate 32a. The two sources and the two drains are individually short-circuited by way of respective wiring lines not shown. Also the three MOS FETs 26P2, 27N2 and 34N2 constituting the second CMOS invertor circuit 29 are similarly formed as a single unit having a triplet structure.

Referring back to FIG. 5, the output signal of the temperature detection circuit 21 changes from a HIGH level to a LOW level when the temperature of the signal delaying outputting circuit exceeds the preset detection temperature T1, and the output signal of the temperature detection circuit 35 changes from a HIGH level to a LOW level when the temperature of the signal delaying outputting circuit exceeds another preset detection temperature T2 which is higher than the preset detection temperature T1. Thus, when the temperature of the signal delaying outputting circuit exceeds the preset detection temperature T1, both of the first auxiliary MOS FET 27P1 and the second auxiliary MOS FET 27N2 are turned on similarly as in the signal delaying outputting circuit of FIG. 1. Consequently, the transmission delay times of the first and second CMOS invertor circuits 28 and 29 and hence the total transmission delay time decreases suddenly. When the temperature of the signal delaying outputting circuit further rises until it exceeds the preset detection temperature T2, also the auxiliary p-channel MOS FET 34P1 and the auxiliary n-channel MOS FET 34N2 are both turned on. Consequently, also in this instance, the individual transmission delay times and the total transmission delay time of the first CMOS invertor circuit 28 and second CMOS invertor circuit 29 decrease suddenly.

Figure 7:
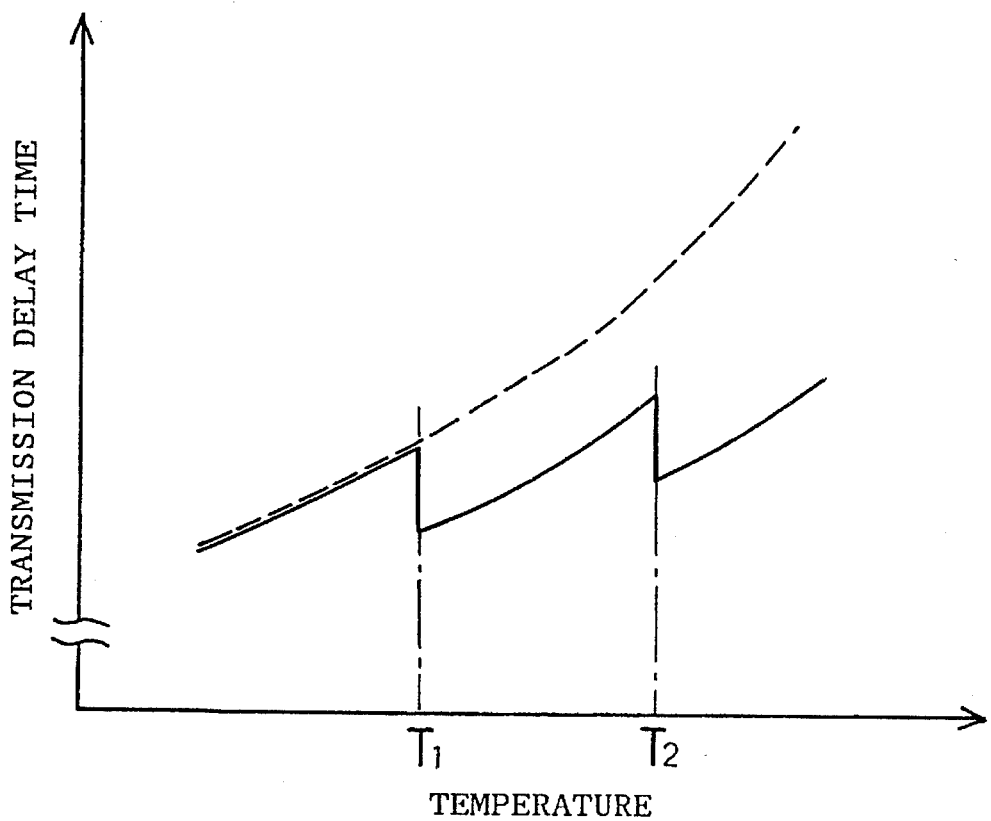
FIG. 7 is a graph illustrating a delay characteristic of the signal delaying outputting circuit of FIG. 5 with respect to a temperature variation together with a delay characteristic of the conventional signal delaying outputting circuit.

FIG. 7 illustrates the a delay characteristic of the signal delaying outputting circuit of the second embodiment of the present invention with respect to the temperature variation in comparison with that of the conventional signal delaying outputting circuit shown in FIG. 9. With the signal delaying outputting circuit of the second embodiment of the present invention, the transmission delay time drops twice at the temperature T1 and the temperature T2. Consequently, the variation in transmission delay time caused by a temperature variation is reduced comparing with that of the signal delaying outputting circuit of the first embodiment shown in FIG. 1.

Having now fully described the invention, it will be apparent to one of ordinary skill in the art that many changes and modifications can be made thereto without departing from the spirit and scope of the invention as set forth herein.

What is claimed is:

1. A signal delaying outputting circuit having an input terminal, an output terminal, a high voltage power source terminal and a low voltage power source terminal, comprising:

a first invertor circuit including a first p-channel MOS FET and a first n-channel MOS FET connected in series between said high voltage power source terminal and said low voltage power source terminal and driven by a signal from said input terminal for delaying and amplifying the signal from said input terminal by current amplification;

a second invertor circuit including a second p-channel MOS FET and a second n-channel MOS FET connected in series between said high voltage power source terminal and said low voltage power source terminal and driven by an output signal of said first invertor circuit for delaying and amplifying the output signal of said first invertor circuit by current amplification;

said output terminal being connected to a junction between said second p- and n-channel MOS FETs of said second invertor circuit to output the signal delayed and amplified by said first and second invertor circuits;

a first auxiliary MOS FET of the same channel type as that of one of said first p- and n-channel MOS FETs of said first invertor circuit, said first auxiliary MOS FET being provided in said first invertor circuit in an integral continuous relationship such that it has a gate separate from a gate of the one of said first p- and n-channel MOS FETs of said first invertor circuit but has a source or a drain commonly with the one of said first p- and n-channel MOS FETs of said first invertor circuit;

a second auxiliary MOS FET of the same channel type as that of one of said second p- and n-channel MOS FETs of said second invertor circuit but different from that of said first auxiliary MOS FET, said second auxiliary MOS FET being provided in said second invertor circuit in an integral continuous relationship such that it has a gate separate from a gate of the one of said second p- and n-channel MOS FETs of said second invertor circuit but has a source or a drain commonly with the one of said second p- and n-channel MOS FETs of said second invertor circuit; and a temperature detection circuit for detecting whether a temperature of said signal delaying outputting circuit is higher than a predetermined level and outputting a result of the detection as a binary signal to control switching operations of said first and second auxiliary MOS FETs, wherein the switching operation of one of said first and second auxiliary MOS FETs is controlled by a logical OR signal of the signal from said input terminal and an output signal of said temperature detection circuit, and the switching operation of the other of said first and second auxiliary MOS FETs is controlled by an inverted signal of the logical OR signal.

2. A signal delaying outputting circuit as claimed in claim 1, wherein each of said first and second auxiliary MOS FETs and said temperature detection circuit is provided by an equal plural number, and each first auxiliary MOS FET is provided in an integral continuous relationship such that it has a gate separate from the gate of the one of the first p- and n-channel MOS FETs of said first invertor circuit but has a source or a drain commonly with the one of the first p- and n-channel MOS FETs of said first invertor circuit while each second auxiliary MOS FET is provided in an integral continuous relationship such that it has a gate separate from the gate of the one of the second p- and n-channel MOS FETs of said second invertor circuit but has a source or a drain commonly with the one of the first p- and n-channel MOS FETs of said second invertor circuit, the switching operations of said first and second auxiliary MOS FETs being controlled by output signals of the corresponding temperature detection circuits.

3. A signal delaying outputting circuit as claimed in claim 1, wherein, in each of said first and second invertor circuits, the on-state resistances of the auxiliary MOS FET and the one MOS FET integral with and continuous to the auxiliary MOS FET are higher than the on-state resistance of the other MOS FET for which the auxiliary MOS FET is not provided.

* * * * *